United States Patent
Kim et al.

(10) Patent No.: US 7,816,197 B2
(45) Date of Patent: Oct. 19, 2010

(54) ON-CHIP ADJUSTMENT OF MIMCAP AND VNCAP CAPACITORS

(75) Inventors: Jonghae Kim, Fishkill, NY (US); Moon J. Kim, Wappingers Falls, NY (US); Jean-Oliver Plouchart, New York, NY (US); Robert E. Trzcinski, Rhinebeck, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/437,575

(22) Filed: May 8, 2009

(65) Prior Publication Data

US 2009/0213522 A1 Aug. 27, 2009

Related U.S. Application Data

(62) Division of application No. 11/436,249, filed on May 18, 2006, now Pat. No. 7,579,644.

(51) Int. Cl.
*H01L 29/94* (2006.01)
(52) U.S. Cl. ........................ 438/197; 438/379
(58) Field of Classification Search ............... 438/197, 438/379
See application file for complete search history.

(56) References Cited

U.S. PATENT DOCUMENTS

| | | | |
|---|---|---|---|
| 5,636,099 A | 6/1997 | Sugawara et al. | |
| 6,667,506 B1 * | 12/2003 | Reedy et al. | 257/314 |
| 2001/0035797 A1 | 11/2001 | Gutierrez | |
| 2003/0052389 A1 * | 3/2003 | Maeda et al. | 257/595 |
| 2003/0107442 A1 | 6/2003 | Staszewski | |
| 2004/0150939 A1 | 8/2004 | Huff | |

FOREIGN PATENT DOCUMENTS

WO  WO 02/084684 A2  10/2002

OTHER PUBLICATIONS

Jonghae, Kim et al, "Design and Manufacturability Aspect of SOI CMOS RFICs" Custom Integrated Circuits Conference, 2004, Proceedings of the IEEE 2004 Orlando, FL, USA Oct. 3-6, 2004, Piscataway, NJ, USA, IEEE, Oct. 3, 2004 pp. 541-548, XP010742374.

* cited by examiner

*Primary Examiner*—Thomas L Dickey
(74) *Attorney, Agent, or Firm*—Patrick J. Daugherty; Driggs, Hogg, Daugherty & Del Zoppo Co., LPA

(57) ABSTRACT

One or more on-chip VNCAP or MIMCAP capacitors utilize a variable MOS capacitor to improve the uniform capacitance value of the capacitors. This permits the production of silicon semiconductor chips on which are mounted capacitors having capacitive values that are precisely adjusted to be within a range of between about 1% and 5% of their design value. This optimization can be achieved by the use of a back-to-back connection between a pair of the variable MOS capacitors for DC decoupling. It involves the parallelization of on-chip BEOL capacitance of VNCAP and/or MIMCAP capacitors by the insertion in the FEOL of pairs of back-to-back variable MOS capacitors.

20 Claims, 7 Drawing Sheets

ON-CHIP ADJUSTMENT OF MIMCAP AND VNCAP CAPACITORS

CROSS REFERENCE TO RELATED APPLICATION

This application is a division of application Ser. No. 11/436,249, filed May 8, 2006.

FIELD OF THE INVENTION

This invention relates to capacitors on semiconductor chips. More particularly, the invention relates to silicon semiconductor chips on which are mounted capacitors having capacitive values that are precisely calibrated within a range of between about 1% and 5% of their target values.

BACKGROUND OF THE INVENTION

To enhance the understanding of the discussion that follows, the abbreviations and terms listed below will have the definitions as shown.
ADC—Analog to digital converter
BEOL—Back end of line
CA—Tungsten contact between metal and polysilicon
$C_{sub}$—Adjustable capacitor
DAC—Digital to analog converter
FEOL—Front end of line
MIMCAP—Metal-insulator-metal capacitor
MOS—Metal oxide silicon
RF—Radio frequency
VNCAP—Vertical native capacitor On-chip capacitors are critical components of integrated circuits that are fabricated on silicon semiconductors. These capacitors are used for a variety of purposes including bypass and capacitive matching as well as coupling and decoupling. These various uses of capacitors are generally well known and need not be elaborated upon.

One of the drawbacks in present on-chip capacitor designs is the inability to accurately predict the value of an on-chip capacitor. In fact, an error of 5% or more in the design value of the capacitor is common, resulting in differences of 10% or more between high and low capacitor values. These variations are based on factors, such as variables in silicon technology manufacturing process values and temperatures, and are particularly significant in the production of VNCAP and MIMCAP on-chip capacitors. Unfortunately, there is no known procedure to adjust or tune the capacitance value of a capacitor after its manufacture.

Precision on-chip capacitors are particularly important for use in integrated circuits requiring accuracy. Examples of such uses are radio frequency matching circuits and analog circuits, such as DAC, ADC and switch capacitor filters with precisely adjustable capacitance. The need for accuracy results in high rejection rates and decreased yields in chip production.

BRIEF DESCRIPTION OF THE PRESENT INVENTION

The present invention relates to VNCAPs and or MIMCAPS to which are added a variable MOS capacitor to adjust for target capacitance.

Another aspect of the invention is the use of two back to back variable MOS capacitors to adjust for the target on-chip capacitance values.

The invention also relates to the optimization of FEOL capacitors and BEOL capacitors using variable MOS capacitors in parallel therewith.

Still another aspect of the invention is the use of a back-to-back connection between a pair of variable MOS capacitors to DC—decouple the ports of MIM and VN capacitors.

Another aspect is the parallelization of on-chip BEOL capacitance compensation by adjusting FEOL variable capacitors.

These features are achieved by providing a capacitance circuit mounted on a semiconductor chip wherein the circuit comprises at least one fixed value capacitor selected from the group consisting of an MIMCAP and a VNCAP and combinations thereof. A pair of variable MOS capacitors is coupled in parallel with each of the fixed value capacitors to adjust the total output value of each capacitor in the group. The fixed value of each of the fixed value capacitors is within a value of ±5 to 10% of design value before adjustment. By the use of the back-to-back variable MOS capacitors, this value can be improved to be within a value of between 1% and 5% of design value after adjustment. The MIMCAP and VNCAP capacitors typically are mounted in the BEOL of the chip and the variable MOS capacitors are mounted in the FEOL of the chip. Each of the MOS capacitors normally has a design capacitances of about 10% of the value of the MIMCAP and the VNCAP.

The invention also relates to an integrated circuit mounted on a semiconductor chip including at least one VNCAP or MIMCAP and a pair of adjustable sub capacitors. These sub capacitors are MOS capacitors mounted back-to-back, and are connected in parallel with each fixed value capacitor. The value of each of the fixed value capacitors is within a value of ±5 to 10% of design value before adjustment and within a value of between 1% and 5% of design value after adjustment. The MIMCAP and VNCAP capacitors are normally mounted in the BEOL of the semiconductor chip and the variable MOS capacitors are mounted in the FEOL of the chip. Typically, each of the MOS capacitors has a value which is a fraction of the value of the MIMCAP and the VNCAP to which they are connected in parallel. A capacitance value of about 10% of the value of the MIMCAP or the VNCAP is found to be satisfactory for the MOS.

The invention also relates to a method for adjusting the capacitance of on-chip fixed value capacitors selected from the group of MIMCAP capacitors and VNCAP capacitors. The method comprises connecting a pair of back-to-back variable MOS capacitors in parallel with the fixed value capacitors. The total capacitance of each of the VNCP and MIMCAP capacitors is calculated according to the following equations:

$$C_{TOTAL} = C_{MAIN} + \frac{C_{SUB1(V_{ADJ})} + C_{SUB2(V_{ADJ})}}{C_{SUB1(V_{ADJ})} \cdot C_{SUB2(V_{ADJ})}}$$

$$\text{When} \rightarrow C_{SUB1(V_{ADJ})} = C_{SUB2(V_{ADJ})}$$

$$= C_{SUB(V_{ADJ})}$$

$$C_{TOTAL} = C_{MAIN} + \frac{C_{SUB(V_{ADJ})}}{2}$$

BRIEF DESCRIPTION OF THE DRAWINGS

The various drawings are intended to assist in a complete understanding of the features of the invention, and are not presented as a limitation on the scope thereof.

DETAILED DESCRIPTION OF THE INVENTION

Figure 1:
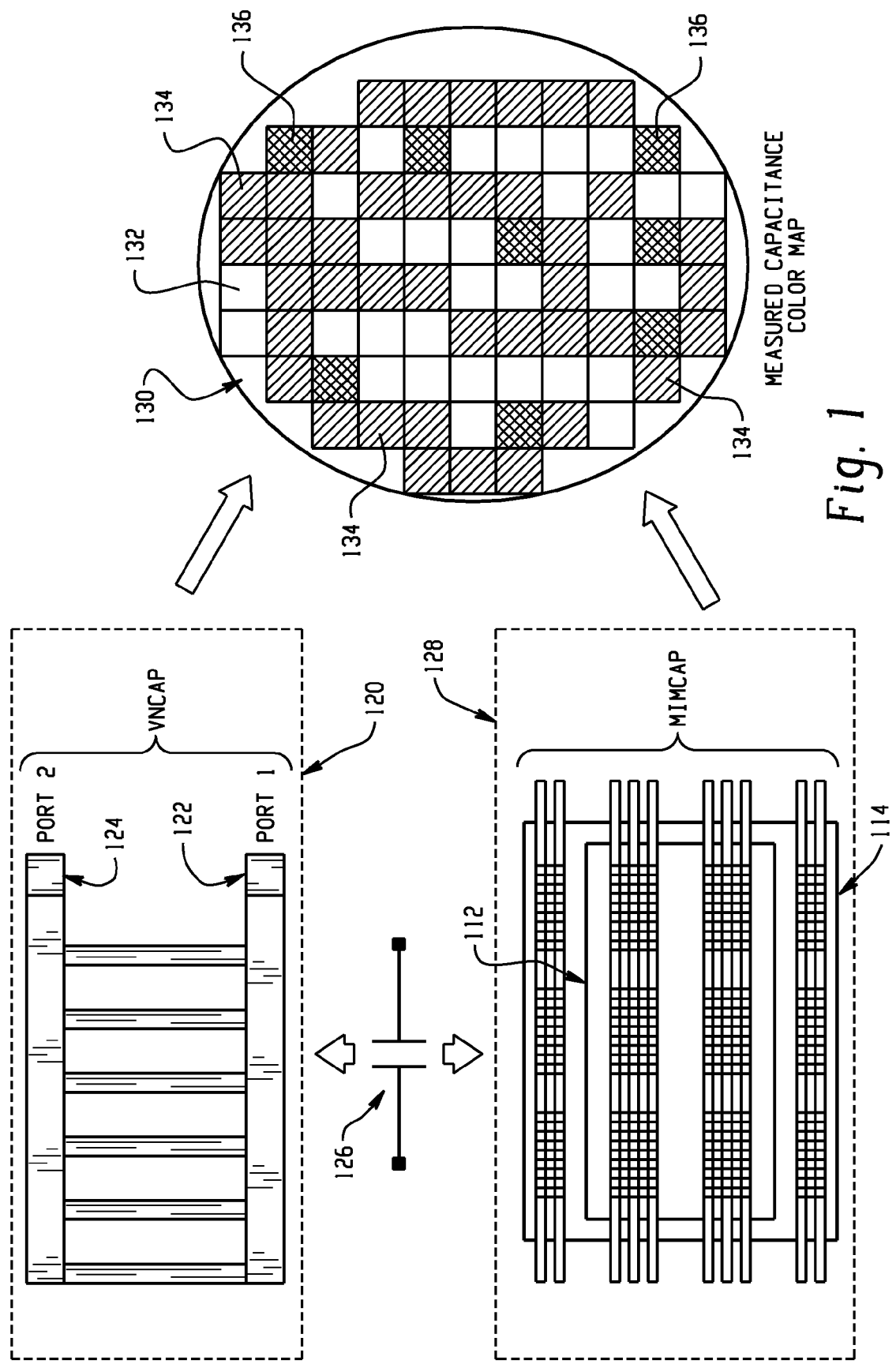
FIG. 1 represents measured variations of on-chip capacitors, such as VNCAP and MIMCAP capacitors.

FIG. 1 shows the current state of the art on-chip capacitors VNCAP (120) and MIMCAP (128) and a measured capacitance color map. The VNCAP (120) has two vertical capacitor ports, PORT 1 (122) and PORT 2 (124) and consists of alternating parallel conductive plates and insulators to generate capacitance. The MIMCAP (128) also has two ports which are top plate (112) and bottom plate (114) and has an insulator (or dielectric) between two plates. These on-chip capacitors can be more simply shown by the capacitor symbol (126). The on-chip capacitors can present huge variations (>±10%) from target values when measured as shown in FIG. 1 (E).

The capacitance map shows how much the capacitance value of on-chip capacitors can vary. This example shows a 300 mm wafer (130) that includes 77 sites with different patterns to represent variations from a targeted capacitance. The sites (132) with no cross hatching represent the highest capacitance value. The sites (134) with a single cross hatching have a middle capacitance value. The sites (136) with a double cross hatching have the lowest capacitance. In most cases, on-chip capacitors can vary by as much as ±10% of the designed values, giving a total differential of 20% or more. This capacitance variation is not only due to manufacturing variations, but also to temperature fluctuations.

To overcome the problems in chip to chip capacitance variations, a variable MOS capacitor is joined in parallel with a VNCAP and/or a MIMCAP in order to adjust for the target capacitance. Adding such an MOS capacitor to a VNCAP structure is shown in FIG. 2 wherein 2(a) represents the prior art and 2(b) shows the new structure according to the present invention.

Figure 2A:
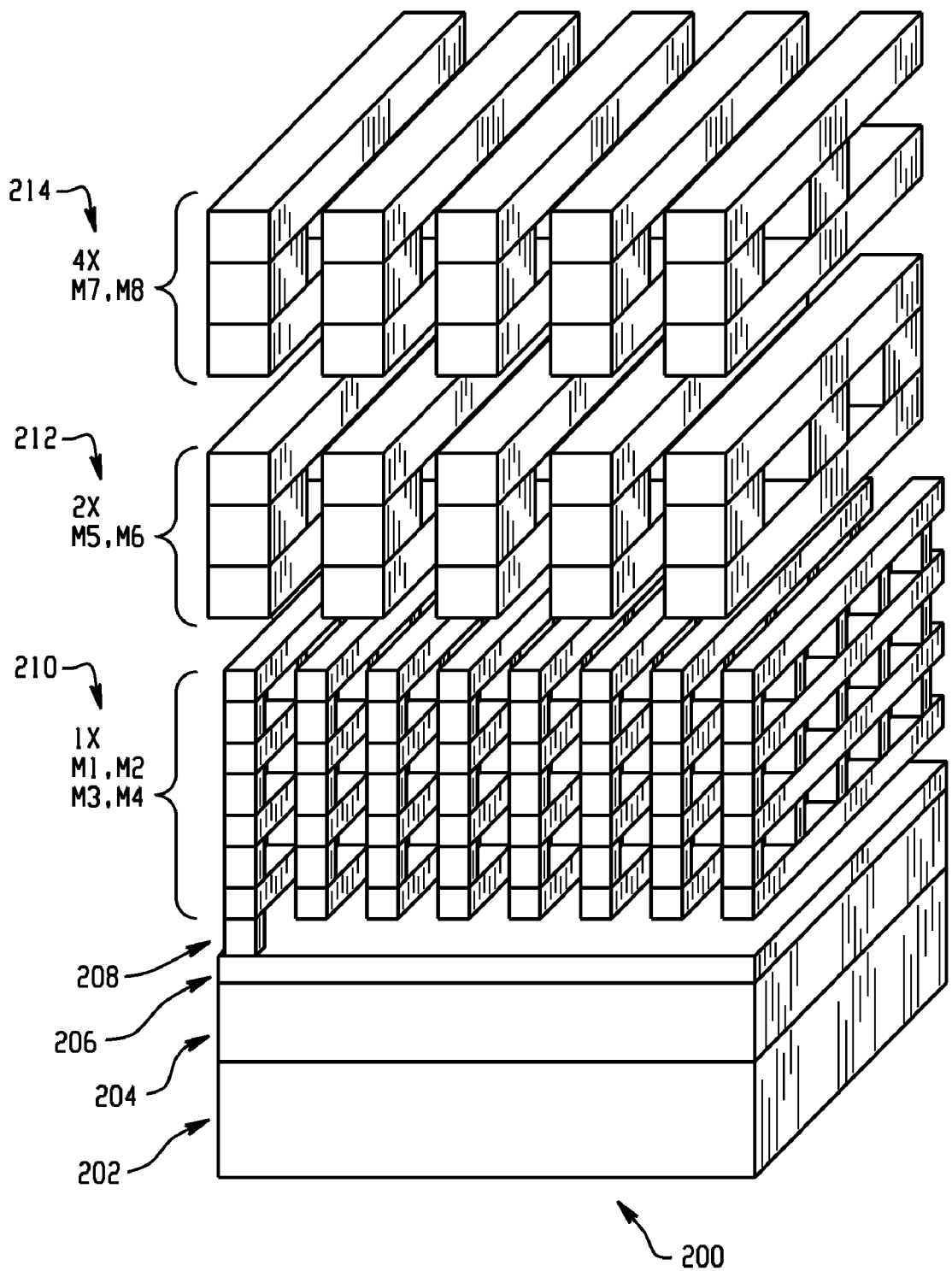
FIG. 2 is a comparative view of a prior art VNCAP structure and a VNCAP structure of the present invention.

In FIG. 2(a), the overall chip assembly (200) comprises a solid substrate (202), a layer of silicon (204) on the substrate, and a layer of polysilicon (206) on top of the silicon. The layer of CA (208) provides a contact interface between the polysilicon (206) and the first metal layers (210) shown as M1 through M4. The substrate, silicon, polysilicon, and CA layers comprise the FEOL of the assembly. The second metal layers (212) are mounted on the first layers (210), and third metal layers (214) are mounted atop the second layers (212). These metal layers all comprise the BEOL of the chip assembly.

Figure 2B:
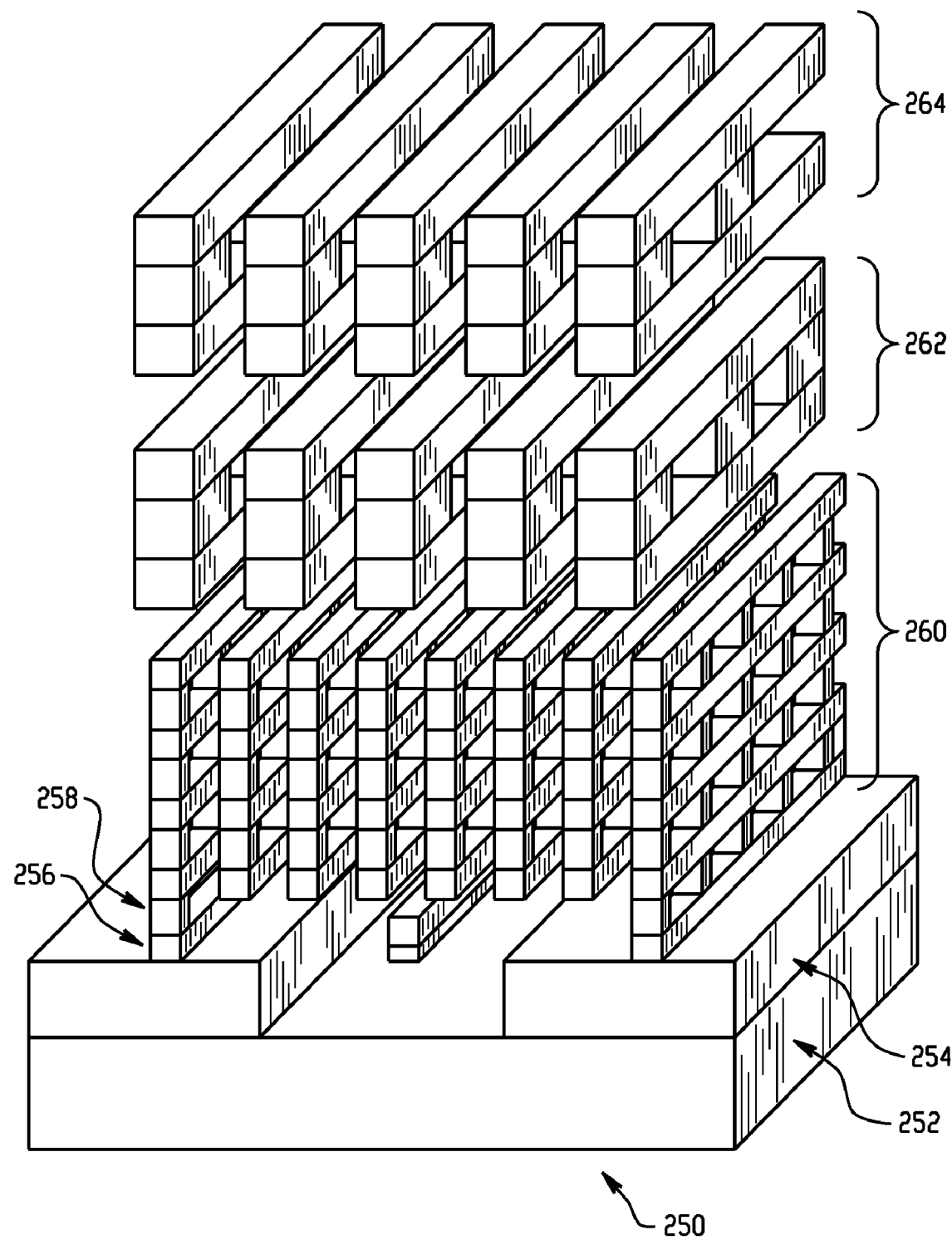

FIG. 2(b) shows an assembly (250) according to the present invention. The FEOL comprises a substrate (252), a layer (254) of silicon mounted on the substrate, and a layer (256) of polysilicon. These polysilicon layers are bonded to the VNCAP through layers (258) of CA. As in FIG. 2(a), the VNCAP comprises first metal layers (260), second metal layers (262) and third metal layers (264). According to the invention, an MOS capacitor is designed into the FEOL and is typically connected to the VNCAP (or the MIMCAP) with CA and polysilicon.

Figure 3:
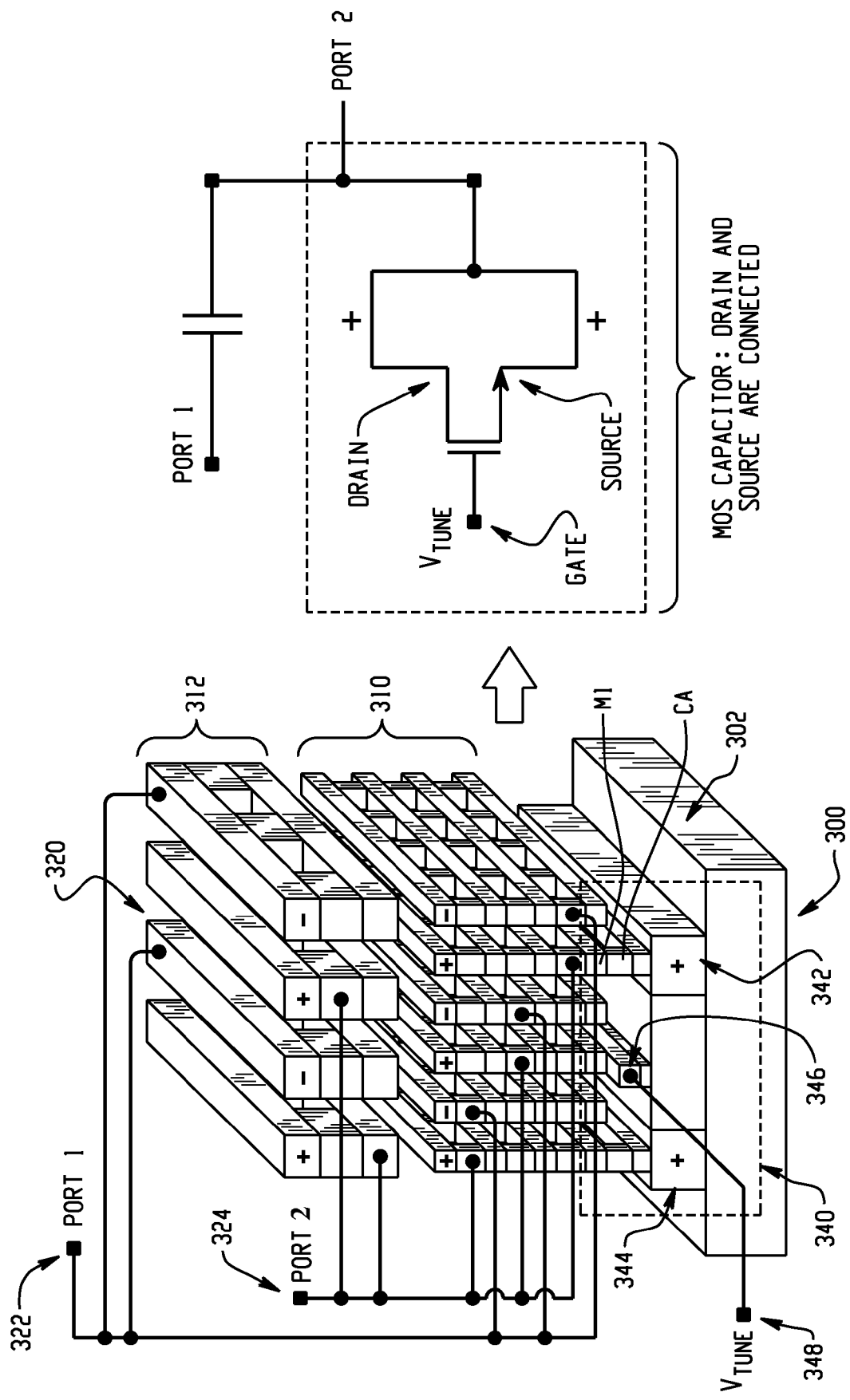
FIG. 3 shows a structural as well as a schematic representation of the present invention.

FIG. 3 shows a different representation of the chip assembly (300) as described in FIG. 2(b), including the connection of the ports of the VNCAP to the variable MOS capacitor. As in FIG. 2(a), the FEOL includes a substrate (302), as well as successive layers of silicon and polysilicon (not shown). The BEOL includes a VNCAP comprising first metal layers (310) and second metal layers (312). According to the invention, an MOS capacitor represented by the dotted lines (340) is designed into the FEOL section of the chip assembly (300) and is typically connected to the VNCAP (or the MIMCAP) with CA and polysilicon (not shown). VNCAP ports 1 (322) and 2 (324) are connected into the MOS capacitor's source (342) and drain (344) with CA and polysilicon. The capacitance of the MOS capacitor is adjusted at gate (346) by regulating the VTUNE port (348). A simplified schematic of this structure is shown on the right hand side of FIG. 3. The total capacitance is the sum of the capacitances of the VNCAP (320) and MOS (340) capacitors. This schematic shows the source and the drain connected to one another.

Figure 4:
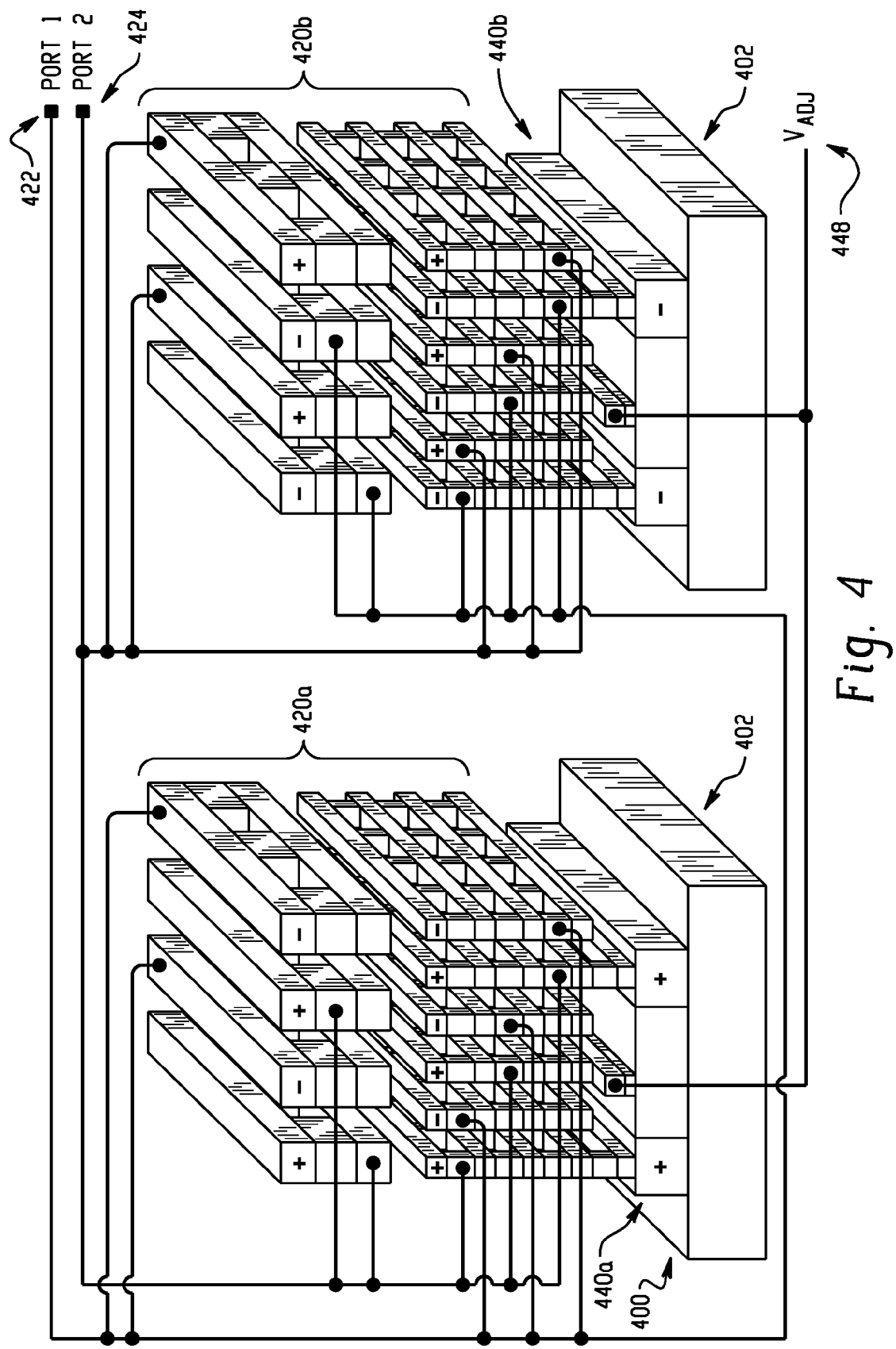
FIG. 4 shows the capacitor geometry according to the present invention.

FIG. 4 shows how the wiring is done for the adjustable on-chip capacitor. Two VNCAPs (420a, 420b) are connected in parallel, and this parallel configuration does not decrease total capacitance $C_{total}$. Ports 1 (422) and 2 (424) are connected to the terminals of two variable MOS capacitors (440a, 440b), and the adjustable port (448) is used for $V_{ADJ}$ of these two MOS capacitors. To decouple the DC adjust voltage (402) at the ports (422, 424), the two MOS capacitors (440a and 440b) are connected back-to-back. Port 1 (422) connects the "−" signed vertical parallel plates of the MOS capacitor (440a). Port 2 (424) connects the "+" signed vertical parallel plates of MOS capacitor (440b). The gates of the two MOS capacitors are tied to each other to adjust the total capacitance.

Figure 5:
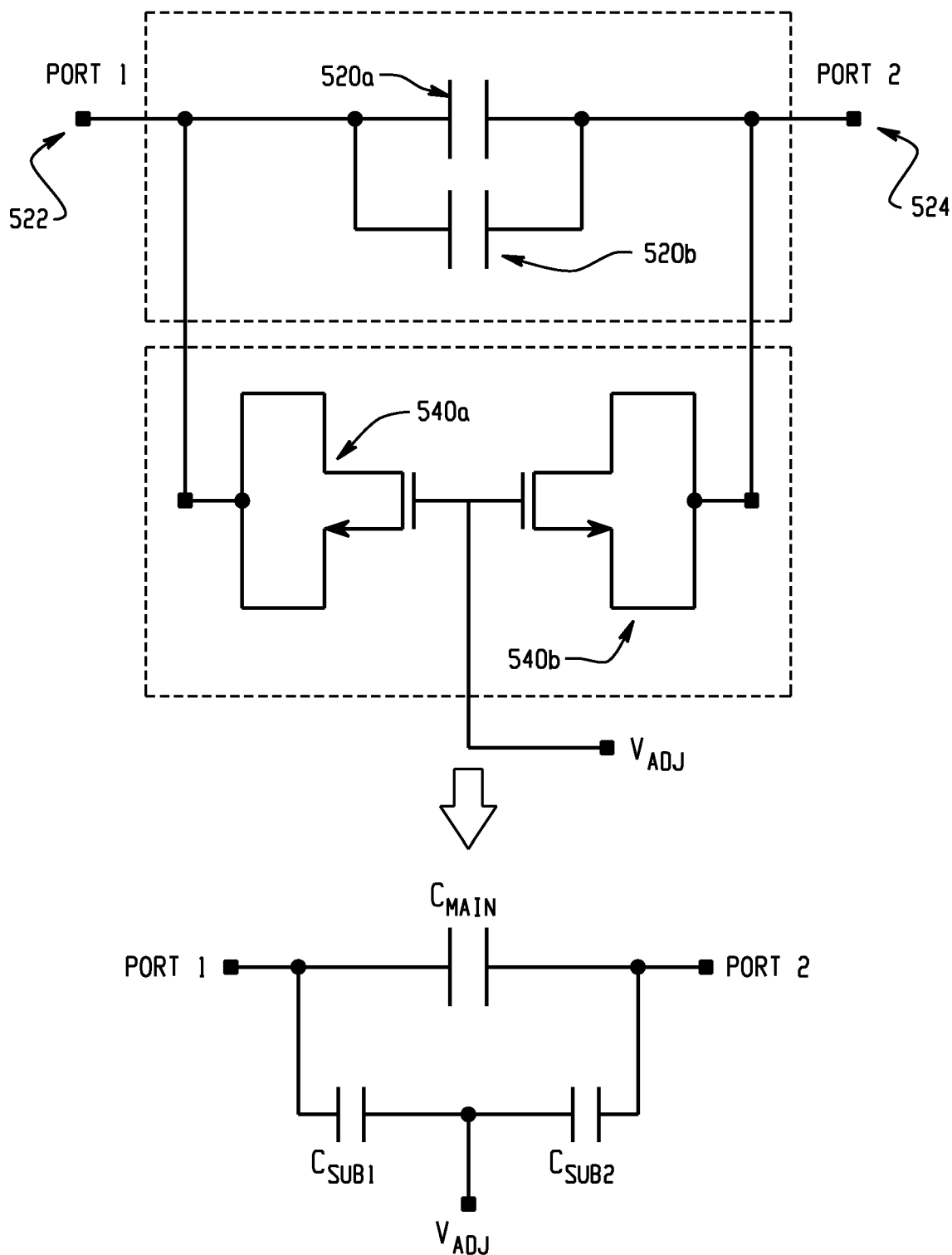
FIG. 5 is the circuit schematic for the geometry presented in FIG. 4.

The simplified circuit schematic of the chip assemblies of FIG. 4 is shown in FIG. 5 where $C_{MAIN}$ is the total capacitance of the two VNCAPs (520a and 520b) joined in parallel and the two MOS sub capacitors (540a and 540b) joined in series. The series connection of the two MOS capacitors represents one half of the total capacitance if the capacitance values of the two capacitors are the same.

The total capacitance $C_{total}$ is calculated according to the following equations:

$$C_{TOTAL} = C_{MAIN} + \frac{C_{SUB1}(V_{ADJ}) + C_{SUB2}(V_{ADJ})}{C_{SUB1}(V_{ADJ}) \cdot C_{SUB2}(V_{ADJ})}$$

$$\text{When} \rightarrow C_{SUB1}(V_{ADJ}) = C_{SUB2}(V_{ADJ})$$

$$= C_{SUB}(V_{ADJ})$$

$$C_{TOTAL} = C_{MAIN} + \frac{C_{SUB}(V_{ADJ})}{2}$$

Consequently, the $C_{MAIN}$ capacitance value can be adjusted by two $C_{SUB}$ capacitors.

Figure 6:
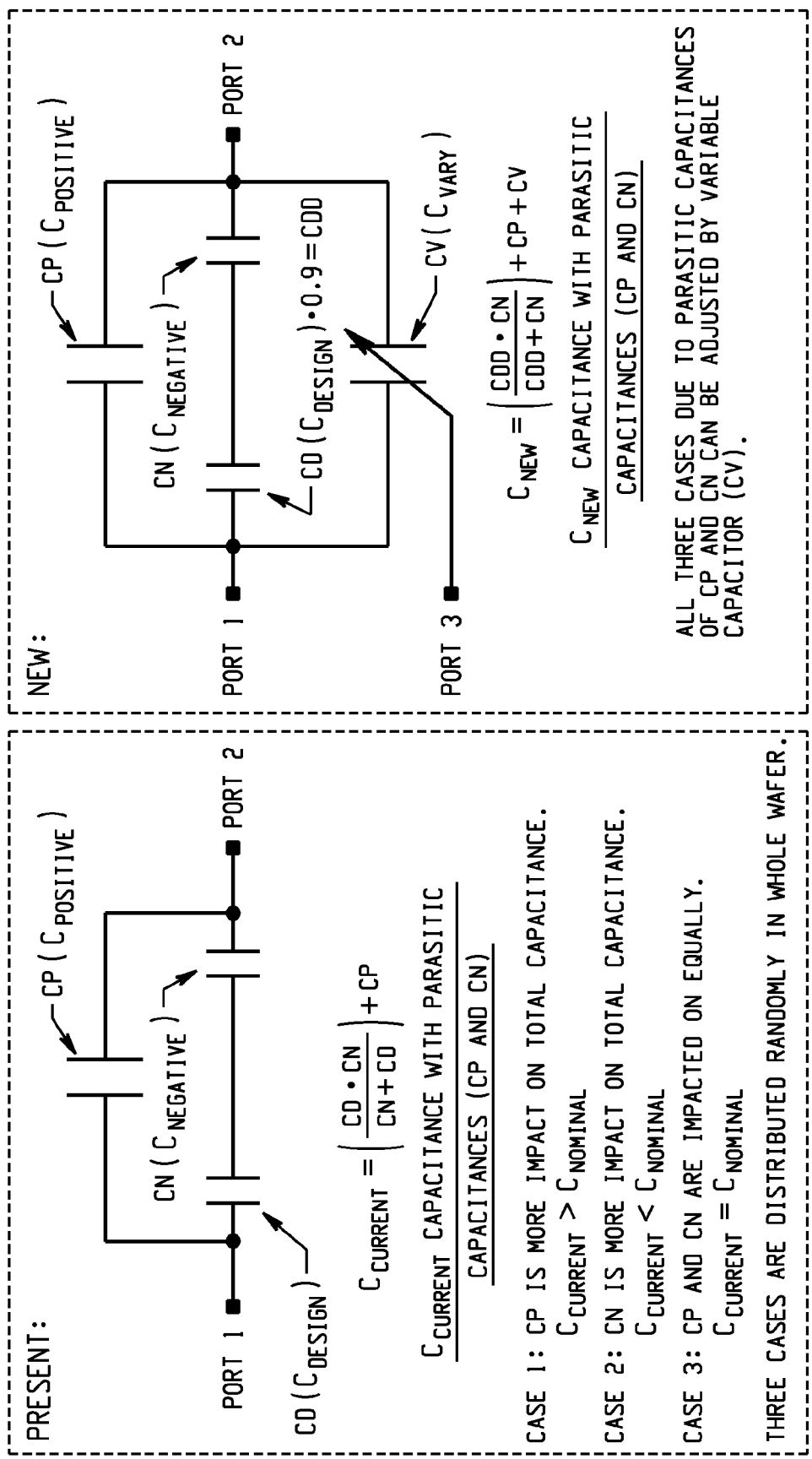
FIG. 6 represents a comparison of capacitance of present on-chip capacitors with those of the present invention.

FIG. 6 shows two simplified circuit diagrams comparing the present invention (shown on the right) with the prior art (shown on the left). In accordance with established practices, the capacitors in the BEOL of the chip assembly are connected with the design capacitance and the negative parasitic capacitances connected in series with one another and in parallel with the positive parasitic capacitance. However, the present invention adds the variable capacitor in parallel with the other capacitors between ports 1 and 2. By the use of this invention, if the actual main capacitance is within 90% of the target value, the total capacitance can be increased with the variable capacitor to compensate for the shortfall. In like manner, if the actual main capacitance is 110% of the target value, the total capacitance may be adjusted downward by the use of the variable capacitor in parallel with the main capacitors.

Among the advantages of the present invention are:

The production of precision on-chip capacitors to improve integrated circuits;

Improved RF matching circuit and analog circuits, such as DAC, ADC and switch capacitor filter with precisely adjustable capacitance;

A new design for a VNCAP to which is added an MOS capacitor to adjust for the target capacitance;

A new design by using two $C_{SUB}$ MOS capacitors to adjust for the target on-chip capacitance;

An optimization method for BEOL capacitor and FEOL variable capacitors;

A back-to-back connection method between FEOL capacitors to DC-decouple for ports; and A parallelization method for on-chip BEOL capacitance compensation by adjusting FEOL variable capacitors.

While specific embodiments of the present invention has been described herein, it is to be understood that variations may be made without departing from the scope thereof, and such variations may be apparent to those skilled in the art represented herein as well as to those skilled in other arts. The materials identified above are by no means the only materials suitable for the manufacture of the VNCAP and MIMCAP capacitors, and substitute materials will be readily apparent to one skilled in the art.

What is claimed is:

1. In a capacitive circuit assembly, a method for adjusting the capacitance of at least one on-chip fixed value capacitor selected from the group of a MIMCAP capacitor and a VNCAP capacitor, connecting a pair of variable MOS sub-capacitors in series with one another and in parallel with said at least one fixed value capacitor, and adjusting the value of the MOS capacitors until the total capacitance is within a target range.

2. The method according to claim 1 including serially connecting the MOS capacitors in a back-to-back arrangement.

3. The method according to claim 1, the method wherein the total capacitance of the capacitive circuit assembly is calculated according to the following equations:

$$C_{TOTAL} = C_{MAIN} + \frac{C_{SUB1}(V_{ADJ}) + C_{SUB2}(V_{ADJ})}{C_{SUB1}(V_{ADJ}) \cdot C_{SUB2}(V_{ADJ})}$$

When $\rightarrow C_{SUB1}(V_{ADJ}) = C_{SUB2}(V_{ADJ})$ $$= C_{SUB}(V_{ADJ})$$

$$C_{TOTAL} = C_{MAIN} + \frac{C_{SUB}(V_{ADJ})}{2}.$$

4. The method according to claim 1 wherein the capacitance value of said at least one fixed value capacitor is within a range of ±10% of design value before adjustment, the method including the step of adjusting the total capacitance of said circuit assembly to within 1% to 5% of design value.

5. The method according to claim 1, including the steps of mounting said at least one fixed value capacitor in the BEOL of the chip, and mounting the variable MOS sub capacitors in the FEOL of the chip.

6. The method according to claim 5 wherein the at least one FEOL variable capacitor is adjusted to parallelize the BEOL capacitance compensation.

7. The method according to claim 1, including the further step of selecting the capacitance of said at least one of the fixed value capacitor at about one picofarad.

8. The method according to claim 1 including the further step of setting the capacitance value of each MOS sub capacitor in the pair at about 10% of the fixed value of the corresponding MIMCAP or VNCAP capacitor.

9. The method according to claim 1 wherein the back to back connections of the variable capacitors DC decouples the ports of said at least one fixed value capacitor.

10. The method according to claim 1, including matching a pair of fixed value VNCAP or MIMCAP capacitors using a corresponding pair of variable MOS sub capacitors that are connected back-to-back, and in parallel with the respective fixed value capacitor.

11. The method according to claim 10, including connecting each VNCAP or MIMCAP in the pair to the other in parallel, each pair having two ports, connecting one port into a drain of one of the MOS sub capacitors, and connecting the other port to a drain of the other MOS sub capacitor.

12. A method of adjusting the value of a fixed value capacitor circuit mounted on a semiconductor chip including a pair of adjustable sub capacitors connected back-to-back with one another, and in parallel with at least one fixed value capacitor in said capacitor circuit, wherein said at least one fixed value capacitor is selected from the group consisting of a VNCAP and a MIMCAP, wherein the value of each said fixed value capacitor is within a range of ±10% of design value before adjustment of the adjustable sub capacitors and within a range of between 1% and 5% of design value after adjustment.

13. The method according to claim 12 including mounting the MIMCAP or the VNCAP capacitor in the BEOL of the semiconductor chip and mounting the adjustable MOS sub capacitors in the FEOL of the chip.

14. The method according to claim 12, wherein each of the MOS sub capacitors in the pair has a value of about 10% of the value of the MIMCAP or VNCAP capacitor.

15. The method according to claim 12 including connecting each VNCAP or MIMCAP capacitor to a corresponding pair of MOS sub capacitors with CA and polysilicon.

16. The method according to claim 12 wherein the capacitance of each fixed value capacitor is about one picofarad.

17. The method according to claim 12 wherein the fixed value capacitor circuit comprises two fixed value capacitors, the capacitances of which are matched to one another by the use of a corresponding pair of variable MOS sub capacitors for each fixed value capacitor, each pair of MOS sub capacitors being connected back-to-back to one another.

18. The method according to claim 17 including connecting the two fixed value capacitors to one another in parallel, each fixed value capacitor having two ports, one port being connected into a drain of one of the MOS sub capacitors and the other port being connected to a drain of the other MOS sub capacitor.

19. The method according to claim 18 wherein the back to back connections of the adjustable sub capacitors DC decouples the ports of the corresponding fixed value capacitor.

20. The method according to claim 12 including calculating the total capacitance of the fixed value capacitor circuit according to the following equations:

$$C_{TOTAL} = C_{MAIN} + \frac{C_{SUB1}(V_{ADJ}) + C_{SUB2}(V_{ADJ})}{C_{SUB1}(V_{ADJ}) \cdot C_{SUB2}(V_{ADJ})}$$

$$\text{When} \to C_{SUB1}(V_{ADJ}) = C_{SUB2}(V_{ADJ})$$
$$= C_{SUB}(V_{ADJ})$$

$$C_{TOTAL} = C_{MAIN} + \frac{C_{SUB}(V_{ADJ})}{2}.$$

* * * * *